United States Patent
Song et al.

(10) Patent No.: US 8,519,261 B2
(45) Date of Patent: Aug. 27, 2013

(54) PHOTOELECTRIC CONVERSION DEVICE

(75) Inventors: Jung-Suk Song, Yongin-si (KR);
Jeong-Jun Kim, Yongin-si (KR);
Dong-Sik Kwak, Yongin-si (KR)

(73) Assignee: Samsung SDI Co., Ltd., Gyeonggi-do (KR)

( * ) Notice: Subject to any disclaimer, the term of this patent is extended or adjusted under 35 U.S.C. 154(b) by 436 days.

(21) Appl. No.: 12/969,336

(22) Filed: Dec. 15, 2010

(65) Prior Publication Data

US 2011/0232739 A1    Sep. 29, 2011

(30) Foreign Application Priority Data

Mar. 25, 2010    (KR) .................. 10-2010-0026812

(51) Int. Cl.
*H01L 31/0203*    (2006.01)
(52) U.S. Cl.
USPC ........................... 136/259; 136/252; 136/256
(58) Field of Classification Search
USPC ................................................ 136/243–265
See application file for complete search history.

(56) References Cited

U.S. PATENT DOCUMENTS

| | | | |
|---|---|---|---|
| 5,145,793 A | 9/1992 | Oohara et al. | |
| 6,081,071 A | 6/2000 | Rogers | |
| 6,118,573 A * | 9/2000 | Kubo et al. | 359/266 |
| 6,462,266 B1 * | 10/2002 | Kurth | 136/251 |
| 2002/0005977 A1 * | 1/2002 | Guarr et al. | 359/265 |
| 2007/0006917 A1 | 1/2007 | Gonda et al. | |
| 2008/0264482 A1 | 10/2008 | Lee et al. | |
| 2009/0250104 A1 | 10/2009 | Inoue et al. | |
| 2009/0272433 A1 | 11/2009 | Morooka et al. | |

FOREIGN PATENT DOCUMENTS

| | | |
|---|---|---|
| DE | 10 2009 012 545 A1 | 10/2009 |
| EP | 1 939 972 A1 | 7/2008 |
| JP | 2000-265796 | 9/2000 |
| JP | 2005-268239 | 9/2000 |
| JP | 2005-0142090 A | 6/2005 |
| JP | 2007-280906 | 10/2007 |
| JP | 2009-129651 | 6/2009 |

(Continued)

OTHER PUBLICATIONS

Search Report from related European Application No. 11250387.5 dated Aug. 28, 2012, which is related to the present application.

(Continued)

*Primary Examiner* — Jonathan Johnson
*Assistant Examiner* — Christina Chern
(74) *Attorney, Agent, or Firm* — Knobbe, Martens, Olson & Bear LLP

(57) ABSTRACT

A photoelectric conversion device is disclosed. One aspect includes a first substrate and a second substrate spaced apart from each other, an inner sealing portion formed between the first substrate and the second substrate, and an outer sealing portion formed between the first substrate and the second substrate and spaced apart from an outer edge of the inner sealing portion. Furthermore, a plurality of first electrodes may be formed on a surface of the first substrate that faces the second substrate and a current collecting electrode may be formed electrically connecting the first electrodes to each other. The inner sealing portion may be positioned to define a photoelectric conversion region. The current collecting electrode may be formed on the first substrate to extend from a contact with the plurality of first electrodes past an outer sealing region of the outer sealing portion.

9 Claims, 5 Drawing Sheets

(56) References Cited

FOREIGN PATENT DOCUMENTS

| KR | 100654103 B1 | 11/2006 |
| KR | 2008-049168 A | 6/2008 |
| KR | 10-2008-0068666 | 7/2008 |

OTHER PUBLICATIONS

KIPO Registration Determination Certificate (Korean only) in KR 10-2010-0026812 dated Nov. 23, 2011.
KIPO Office Action in KR 10-2010-0026812 dated May 25, 2011.

* cited by examiner

PHOTOELECTRIC CONVERSION DEVICE

CROSS-REFERENCE TO RELATED APPLICATIONS

This application claims priority to and the benefit of Korean Patent Application No. 10-2010-0026812, filed on Mar. 25, 2010, in the Korean Intellectual Property Office, the disclosure of which is hereby incorporated by reference in its entirety.

BACKGROUND

1. Field of the Invention

The disclosed technology relates to a photoelectric conversion device.

2. Description of the Related Art

Extensive research has been conducted on photoelectric conversion devices that convert light into electric energy. From among such devices, solar cells have attracted attention since clean, renewable sunlight may be used as an alternative energy source to polluting, non-renewable fossil fuels. Recent research on solar cells has focused on wafer-based crystalline silicon solar cells using a p-n semiconductor junction. However, because wafer-based crystalline silicon solar cells are formed of a high purity semiconductor material, manufacturing costs are high. Unlike silicon solar cells, dye-sensitized solar cells include a photosensitive dye that absorbs visible light to generate excited electrons, a semiconductor material that receives excited electrons, and an electrolyte that reacts with electrons returning from an external circuit. Since photoelectric conversion efficiency is much higher in dye-sensitized solar cells than in other conventional solar cells, the dye-sensitized solar cells are viewed as next generation solar cells.

SUMMARY OF CERTAIN INVENTIVE ASPECTS

In one aspect, a photoelectric conversion device is disclosed in which an area of a current collecting electrode may be increased to move electrons smoothly, and thereby increase efficiency of the photoelectric conversion device.

In another aspect, a photoelectric conversion device includes, for example, a first substrate and a second substrate spaced apart from each other, an inner sealing portion formed between the first substrate and the second substrate, an outer sealing portion formed between the first substrate and the second substrate and spaced apart from an outer edge of the inner sealing portion, a plurality of first electrodes formed on a surface of the first substrate that faces the second substrate, and a current collecting electrode electrically connecting the first electrodes to each other.

In some embodiments, the inner sealing portion is positioned to define a photoelectric conversion region. In some embodiments, the current collecting electrode is formed on the first substrate to extend from a contact with the plurality of first electrodes past an outer sealing region of the outer sealing portion. In some embodiments, the current collecting electrode extends from an inner sealing region of the inner sealing portion. In some embodiments, the current collecting electrode extends past the outer sealing portion into a peripheral region. In some embodiments, an extension length of the current collecting electrode is greater than a length of the outer sealing region. In some embodiments, the extension length of the current collecting electrode is equal to or less than a sum of a length of the non-peripheral region, a length of the outer sealing region, an interval between the outer sealing portion and the inner sealing portion, and a length of the inner sealing region. In some embodiments, the photoelectric conversion device further includes, for example, a first protective layer disposed on the first electrodes. In some embodiments, the first protective layer overlaps at least a portion of the current collecting electrode. In some embodiments, the photoelectric conversion device further includes, for example, a plurality of second electrodes formed on a surface of the second substrate that faces the first substrate. In some embodiments, the second electrodes are spaced apart from each other and a second protective layer is disposed on the plurality of second electrodes. In some embodiments, the photoelectric conversion device further includes, for example, a semiconductor layer formed to cover the first protective layer in the photoelectric conversion region. In some embodiments, the semiconductor layer includes a photosensitive dye. In some embodiments, the photoelectric conversion device further includes, for example, a first transparent conductive layer formed on the first substrate. In some embodiments, the first electrodes are formed on the first transparent conductive layer. In some embodiments, the photoelectric conversion device further includes, for example, a second transparent conductive layer formed on the second substrate and a catalyst layer formed on the second transparent conductive layer.

BRIEF DESCRIPTION OF THE DRAWINGS

Features of the present disclosure will become more fully apparent from the following description and appended claims, taken in conjunction with the accompanying drawings. It will be understood these drawings depict only certain embodiments in accordance with the disclosure and, therefore, are not to be considered limiting of its scope; the disclosure will be described with additional specificity and detail through use of the accompanying drawings. An apparatus, system or method according to some of the described embodiments may have several aspects, no single one of which necessarily is solely responsible for the desirable attributes of the apparatus, system or method. After considering this discussion, and particularly after reading the section entitled "Detailed Description of Certain Inventive Embodiments" one will understand how illustrated features serve to explain certain principles of the present disclosure.

DETAILED DESCRIPTION OF CERTAIN INVENTIVE EMBODIMENTS

Figure 1:
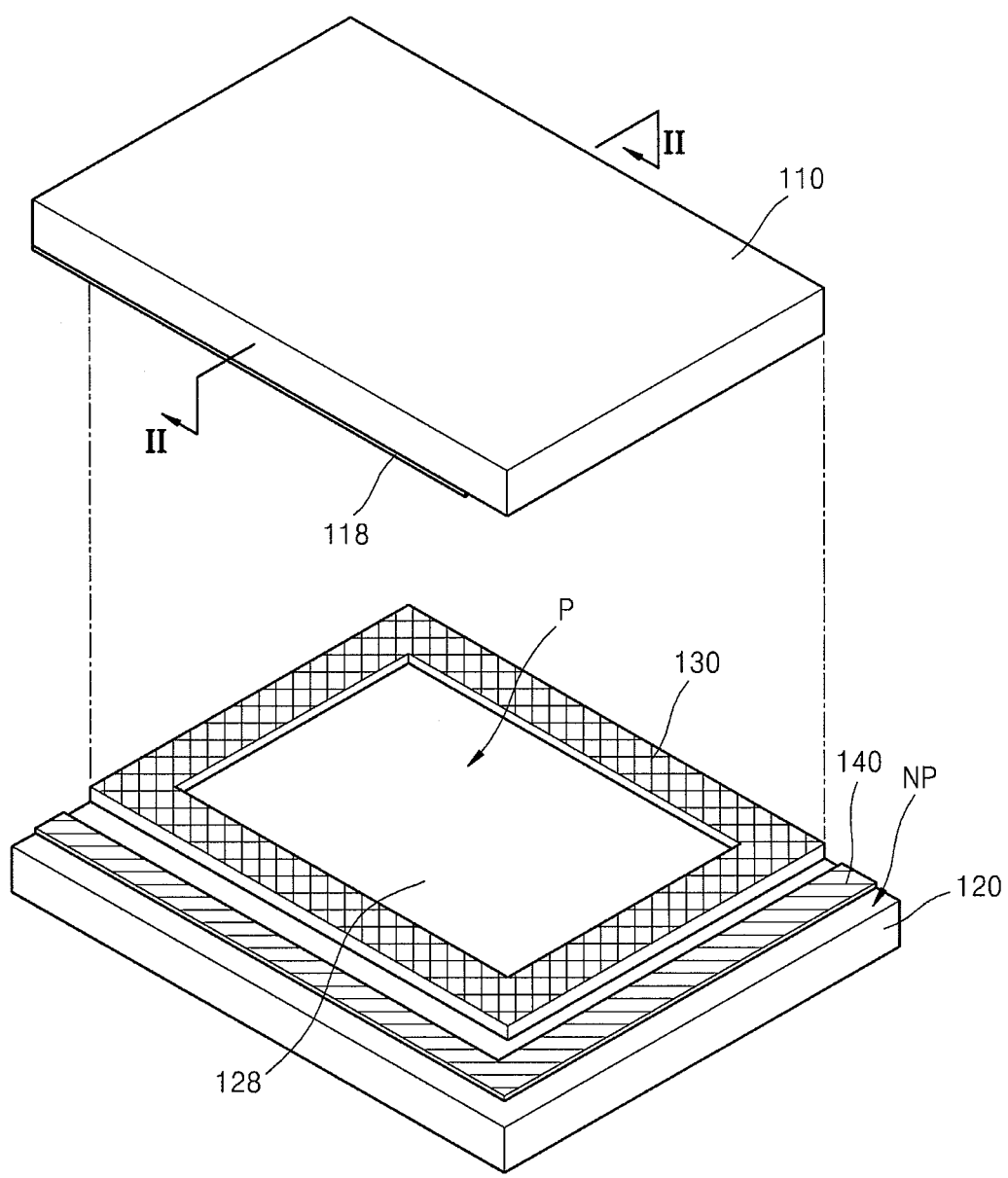
FIG. 1 is an exploded perspective view of a photoelectric conversion device according to one embodiment.

In the following detailed description, only certain exemplary embodiments have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. In addition, when an element is referred to as being "on" another element, it may be directly on the other element or be indirectly on the other element with one or more intervening elements interposed therebetween. Also, when an element is referred to as being "connected to" another element, it may be directly connected to the other element or be indirectly connected to the other element with one or more intervening elements interposed therebetween. Hereinafter, like reference numerals refer to like elements. In this regard, the present embodiments may have different forms and should not be construed as being limited to the descriptions set forth herein. Certain embodiments will be described in more detail with reference to the accompanying drawings, so that a person having ordinary skill in the art may readily make and use aspects of the present disclosure.

FIG. 1 is an exploded perspective view of a photoelectric conversion device according to one embodiment of the present disclosure. Referring to FIG. 1, the photoelectric conversion device may be formed by disposing a first substrate 110 and a second substrate 120 on which functional layers 118 and 128 are respectively formed to face each other. During operation of the device, the functional layers 118 and 128 are used for performing photoelectric-conversion. An inner sealing portion 130 and an outer sealing portion 140 are formed between the first substrate 110 and the second substrate 120 and are positioned to seal the first substrate 110 and the second substrate 120. The inner sealing portion 130 is further positioned to define a photoelectric conversion region P. The outer sealing portion 140 is disposed along edges of the first substrate 110 and the second substrate 120 so as to be spaced apart from the inner sealing portion 130. During manufacture of the photoelectric conversion device, after the functional layers 118 and 128 have been formed on the first substrate 110, the second substrate 120, respectively and the inner sealing portion 130 and the outer sealing portion 140 have been formed, an electrolyte (not shown) is then injected into the photoelectric conversion device through an electrolyte inlet (not shown).

The inner sealing portion 130 is configured to seal the first substrate 110 and the second substrate 120 to prevent leakage of the electrolyte between the first substrate 110 and the second substrate 120. The inner sealing portion 130 is also configured to define the photoelectric conversion region P inside the photoelectric conversion device. The outer sealing portion 140 is configured to reinforce structural strength of the photoelectric conversion device while also being configured to prevent leakage of the electrolyte that has leaked though the inner sealing portion 130.

The functional layers 118 and 128, which are respectively formed on the first substrate 110 and the second substrate 120, may each include a semiconductor layer and an electrode. The semiconductor layer may be configured for generating excited electrons when exposed to light. The electrode may be configured for collecting generated electrons and releasing the electrons out of the functional layers 118 and 128. For example, a portion of the electrodes included in the functional layers 118 and 128 may extend past the outer sealing portion 140 into a peripheral region NP. The electrodes included in the functional layers 118 and 128 may be electrically connected to an external circuit. The electrodes included in the functional layers 118 and 128 may also be positioned so as to extend into the external circuit.

Figure 2:
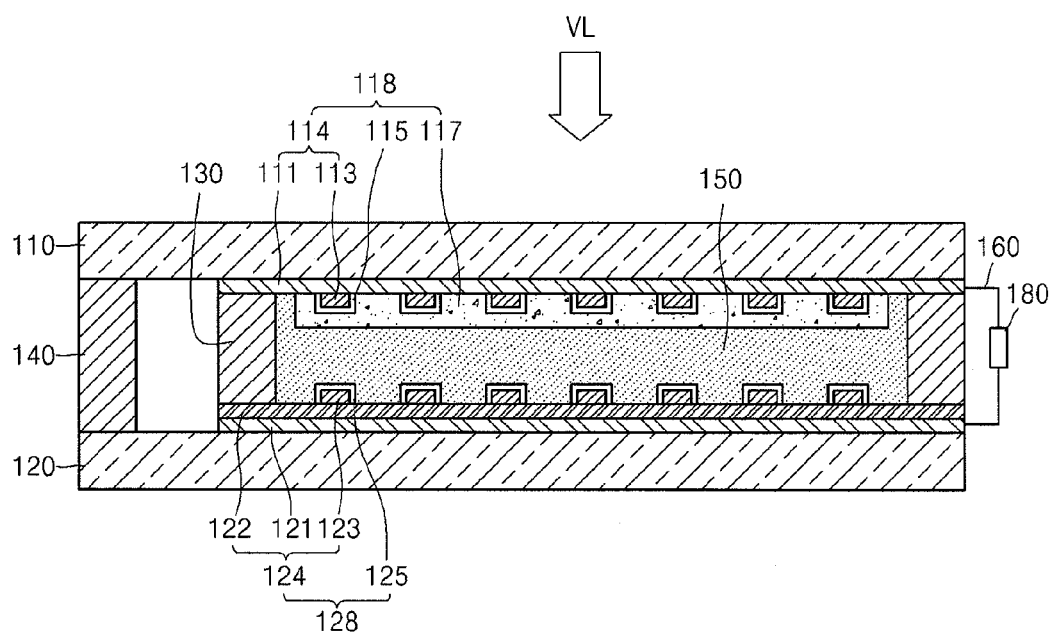
FIG. 2 is a cross-sectional view of the photoelectric conversion device of FIG. 1 taken along a line II-II.

FIG. 2 depicts a cross-sectional view of the photoelectric conversion device taken along a line II-II of FIG. 1. Referring to FIG. 1, the first substrate 110 and the second substrate 120 are formed to face each other. As illustrated in this embodiment, a photo electrode 114 is formed on the first substrate 110 and an opposite electrode 124 is formed on the second substrate 120. A semiconductor layer 117 is formed on the photo electrode 114, and an electrolyte 150 is interposed between the semiconductor layer 117 and the opposite electrode 124. The semiconductor layer 117 is configured to absorb a photosensitive dye excitable by light VL. The photo electrode 114 and the semiconductor layer 117 may correspond to the functional layer 118 formed on the first substrate 110, and the opposite electrode 124 may correspond to the functional layer 128 formed on the second substrate 120.

The first substrate 110 and the second substrate 120 are sealed, and a predetermined space is formed by interposing the inner sealing portion 130 and the outer sealing portion 140 between the first substrate 110 and the second substrate 120. The electrolyte 150, including an electrolyte solution, may fill the space between the first substrate 110 and the second substrate 120, which is defined by the inner sealing portion 130. The inner sealing portion 130 is thus configured to contain the electrolyte 150, and configured to seal the first substrate 110 and the second substrate 120. The inner sealing portion 130 is also thus configured to prevent the electrolyte 150 leakage between the first substrate 110 and the second substrate 120.

The photo electrode 114 and the opposite electrode 124 are electrically connected to each other by a wire line 160 and an external circuit 180. When a plurality of the photoelectric conversion devices are connected in series and/or in parallel to constitute a module, the photo electrodes 114 and the opposite electrodes 124 of the photoelectric conversion devices may be connected in series and/or in parallel. Further, ends of connection portions of the photoelectric conversion devices may be connected to the external circuit 180.

The first substrate 110 may be formed of a transparent material. The first substrate 110 may be formed of a material having a high light-transmittance. For example, the first substrate 110 may include a glass substrate formed of glass or a resin film. One or more types of resin films may be used to achieve flexibility in the first substrate 110.

The photo electrode 114 may include a first transparent conductive layer 111 and a first electrode 113 formed on the first transparent conductive layer 111. The first transparent conductive layer 111 may be formed of a transparent and conductive material, for example, a transparent conducting oxide (TCO) such as an indium tin oxide (ITO), a fluorine-doped tin oxide (FTO), or an antimony tin oxide (ATO). In operation, the first electrode 113 may be used to reduce an electrical resistance of the photo electrode 114. The first electrode 113 may function as a wire line for collecting electrons generated by photoelectric conversion. The first electrode 113 may also function to provide a current path. The first electrode 113 may be formed of a metal having excellent conductivity, such as silver (Au), gold (Au) or aluminum (Al), and may extend in a stripe pattern.

The photo electrode 114 may have a high aperture ratio. In operation, the photo electrode 114 may function as a negative electrode of the photoelectric conversion device. Since the light VL received through the photo electrode 114 is an excitation source of the photosensitive dye adsorbed by the semiconductor layer 117, photoelectric conversion efficiency of the semiconductor layer 117 may be increased by receiving as much of the light VL as possible.

A first protective layer 115 may be formed on an external surface of the first electrode 113. The first protective layer 115 is configured to prevent damage to the first electrode 113. For example, if the first electrode 113 and the electrolyte 150 contact and either electrically or chemically react, the first electrode 113 may corrode. Therefore, the first protective layer 115 may be formed of a material that does not react with the electrolyte 150, for example, a curable resin material.

The semiconductor layer 117 may be formed of a semiconductor material used to form a general photoelectric conversion device. Suitable semiconductor materials may include, for example, a metal oxide such as cadmium (Cd), zinc (Zn), indium (In), lead (Pb), molybdenum (Mo), tungsten (W), antimony (Sb), titanium (Ti), silver (Ag), manganese (Mn), tin (Sn), zirconium (Zr), strontium (Sr), gallium (Ga), silicon (Si), or chromium (Cr). The photoelectric conversion efficiency of the semiconductor layer 117 may be increased by adsorbing a photosensitive dye onto the semiconductor layer 117. For example, the semiconductor layer 117 may be formed with a paste coating. The paste may include dispersed semiconductor particles each having a diameter of between about 5 to about 1000 nm on the first substrate 110. During manufacture, the semiconductor layer 117 with the paste coating is disposed on the photo electrode 114 and then a process is performed that includes heat-treatment or pressure-treatment in which a predetermined amount of heat or pressure is applied on the semiconductor layer 117.

The photosensitive dye adsorbed by the semiconductor layer 117 is configured to absorb the light (VL), which may be received through the first substrate 110. During operation, when the semiconductor layer 117 absorbs the light VL, electrons of the photosensitive dye are excited by the light VL into an excitation state. The excited electrons are transited to a conduction band of the semiconductor layer 117 by using electrical-coupling between the photosensitive dye and the semiconductor layer 117 to reach the photo electrode 114 through the semiconductor layer 117. Excited electrons are then released out of the photoelectric conversion device through the photo electrode 114 to thereby generate a driving current for driving the external circuit 180.

The photosensitive dye adsorbed by the semiconductor layer 117 may include molecules that absorb light in a visible light band and cause a rapid movement of electrons in a light excitation state to the semiconductor layer 117. The photosensitive dye may be in a liquid state, a semisolid gel state, or a solid state. For example, the photosensitive dye adsorbed by the semiconductor layer 117 may be a ruthenium-based photosensitive dye. The first substrate 110 on which the semiconductor layer 117 is formed may be immersed into a solution that includes a predetermined photosensitive dye to obtain the semiconductor layer 117 with the photosensitive dye adsorbed thereon.

The electrolyte 150 may be a redox electrolyte including an oxidizer and a reducer pair, or may be a solid electrolyte, a gel electrolyte, or a liquid electrolyte.

The second substrate 120 facing the first substrate 110 may not be transparent. However, the second substrate 120 may be formed of a transparent material and be configured to receive the light VL from both sides thereof. Being able to receive light VL from both sides of the second substrate 120 would increase the photoelectric conversion efficiency of the semiconductor layer 117. In some embodiments, the second substrate 120 is formed of the same material as the first substrate 110. In particular, when the photoelectric conversion device is used for a Building Integrated Photovoltaic ("BIPV") structure, such as a window frame of a building, both sides of the photoelectric conversion device may be transparent so that the light VL from the sun may not be blocked from entering the building.

The opposite electrode 124 may include a second transparent conductive layer 121, a catalyst layer 122 formed on the second transparent conductive layer 121, and second electrodes 123 formed spaced apart from each other on the catalyst layer 122. The second transparent conductive layer 121 may be formed of a transparent conducting and conductive material, for example, a transparent conducting oxide (TCO) such as an indium tin oxide (ITO), a fluorine-doped tin oxide (PTO), or an antimony tin oxide (ATO). A second protective layer 125 is formed on an external surface of the second electrode 123. The second protective layer 125 may be formed and may have one or more of the same operational functions and advantages for the second electrode 123 as described above with respect to the first protective layer 115 and the first electrode 113.

The catalyst layer 122 may be formed of a material having a reduction catalyst. In operation, the reduction catalyst is configured to provide electrons to the electrolyte 150. Suitable materials for the reduction catalyst may include, for example, a metal such as platinum (Pt), gold (Au), silver (Au), copper (Cu), aluminum (Al), a metal oxide such as a tin oxide, or a carbon-based material such as graphite.

The opposite electrode 124 functions as a positive electrode of the photoelectric conversion device, and functions as a reduction catalyst for providing electrons to the electrolyte 150. The photosensitive dye adsorbed by the semiconductor layer 117 absorbs the light VL and electrons therein are excited and released out of the photosensitive dye. The photosensitive dye from which electrons are released then receives electrons provided by oxidation of the electrolyte 150. The oxidized electrolyte 150 is reduced by electrons that reach the opposite electrode 124 through the external circuit 180, thereby completing the circuit of the photoelectric conversion device.

Figure 3:
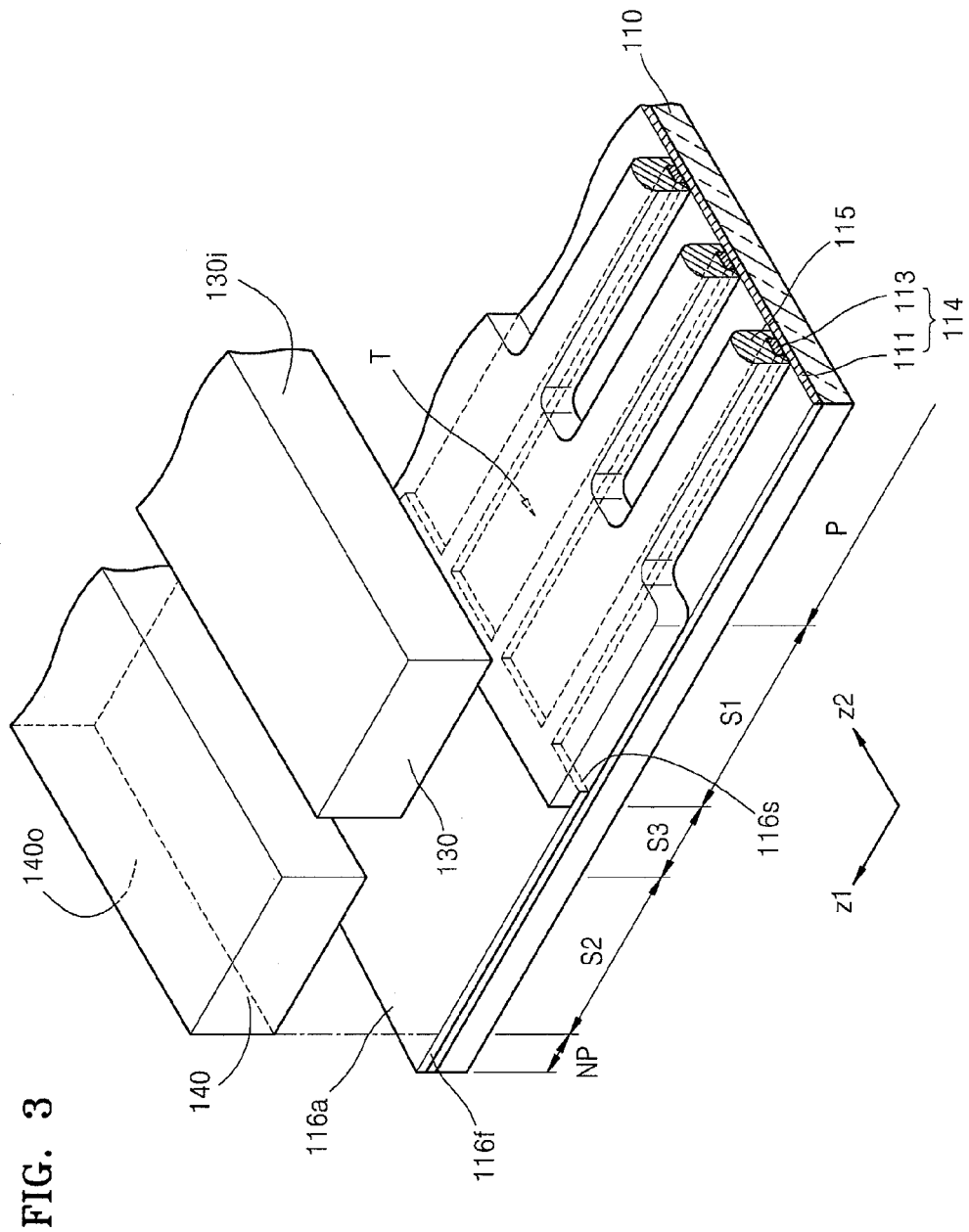
FIG. 3 is a perspective view of a first substrate on which a photo electrode is formed, for showing a sealing structure of a photoelectric conversion device, according to another embodiment.
Figure 4:
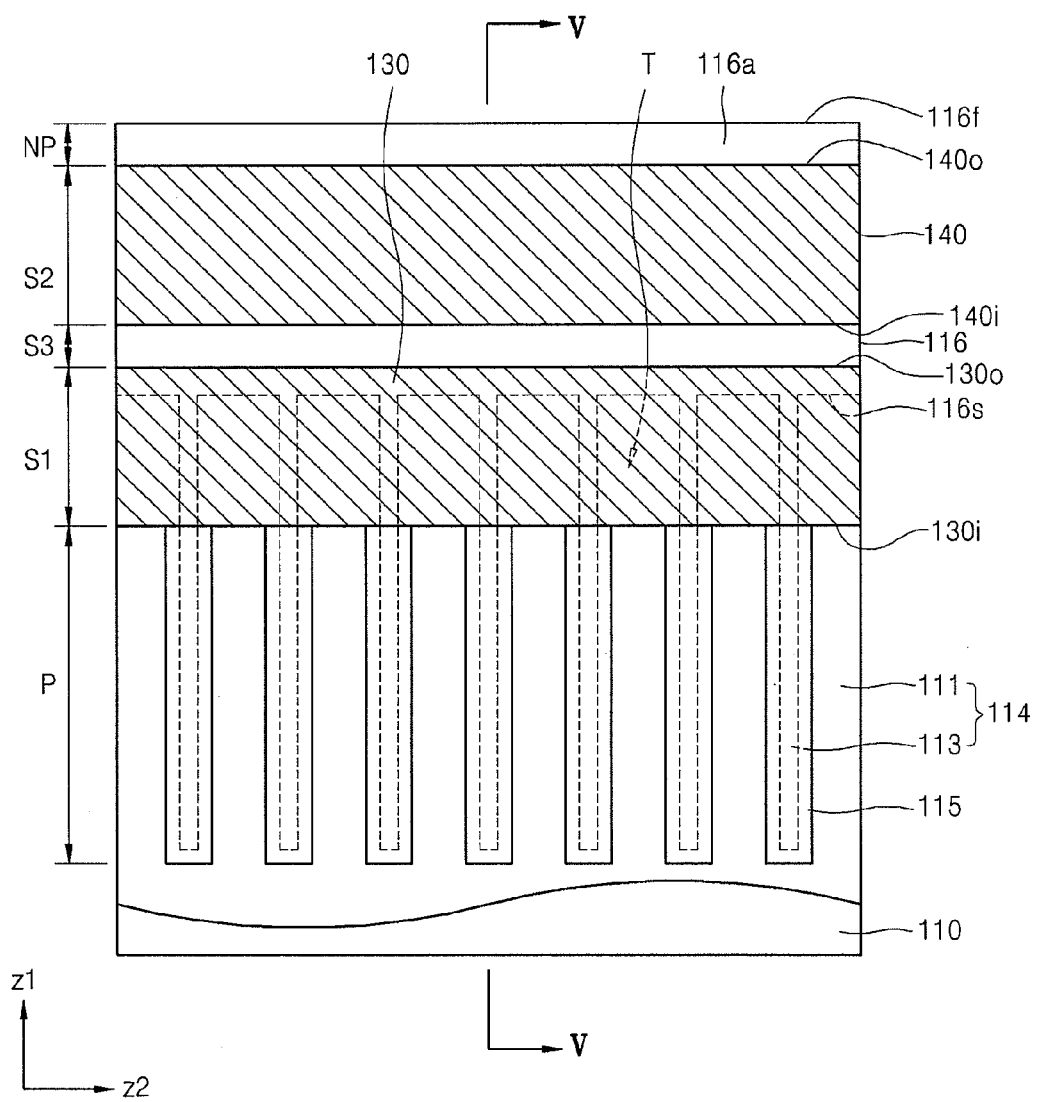
FIG. 4 is a plan view of the first substrate of FIG. 3, which depicts a sealing structure of a photoelectric conversion device, according to another embodiment.

FIGS. 3 and 4 are a partial perspective view and a partial plan view of the first substrate 110 on which the photo electrode 114 is formed. Referring to FIGS. 3 and 4, the first transparent conductive layer 111 is formed on the first substrate 110. The first electrodes 113 formed on the first transparent conductive layer 111 in stripes. The first electrodes 113 extend parallel to each other along a direction Z1, and a current collecting electrode 116 (unmarked) that extends in a direction Z2 crossing the first electrodes 113. The current collecting electrode 116 electrically connects the first electrodes 113 to form a single common wiring formed on the first substrate 110.

When an inner sealing region Si corresponding to the inner sealing portion 130 is used as a boundary, main portions of the first electrodes 113 are disposed within the photoelectric conversion region P. Further, the current collecting electrode 116 is disposed adjacent to a peripheral region NP so as to correspond to an outer sealing region S2. S2 also corresponds to the outer sealing portion 140 on the first substrate 110. To increase an aperture ratio of the photoelectric conversion region P, the current collecting electrode 116 may be opaque. The current collecting electrode 116 may also formed outside of the photoelectric conversion region P, that is, adjacent to the peripheral region NP. The inner sealing portion 130 and the outer sealing portion 140 are spaced apart from each other by a predetermined interval S3.

The current collecting electrode 116 extends across the outer sealing region S2 and at least a portion of the inner sealing region Si corresponding to the inner sealing portion 130. Accordingly, the current collecting electrode 116 may be disposed across an entire surface of the outer sealing region S2, and may selectively extend across the inner sealing region S1. The extending direction of the current collecting electrode 116 is the direction Z1 of FIGS. 3 and 4.

The first electrodes 113 are covered by the first protective layer 115. The first protective layer 115 is configured to extend over the current collecting electrode 116 so as to cover at least a portion of the current collecting electrode 116. In this case, from among portions of the current collecting electrode 116, a space S3 between the inner sealing portion 130 and the outer sealing portion 140, the outer sealing region S2, and an extracted portion 116a are not covered by the first protective layer 115. In particular, the extracted portion 116a may extend out of the outer sealing portion 140 for connection with an external circuit.

The first protective layer 115 is continuously formed in the inner sealing region S1. That is, the first protective layer 115 is formed along the inner sealing region Si without interruption. The first electrodes 113 are spaced apart from each other by an electrode pitch interval. Thus, the first protective layer 115 extends across the first electrodes 113 and fills and covers step differences T between the first electrodes 113.

Figure 5:
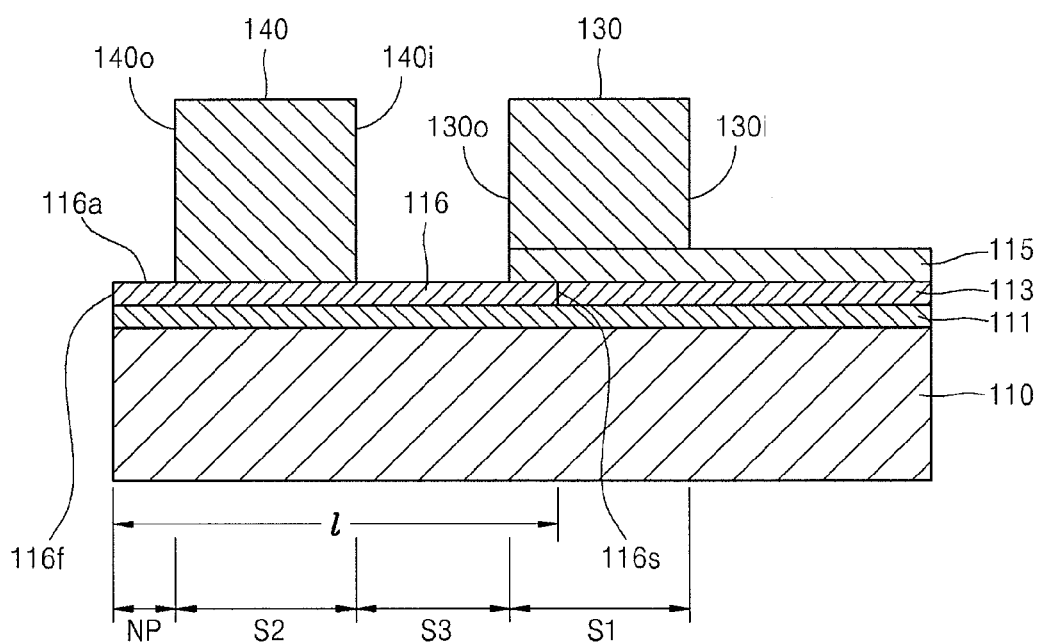
FIG. 5 is a vertical cross-sectional view of the photoelectric conversion device taken along a line V-V of FIG. 4.

FIG. 5 is a vertical cross-sectional view of the photoelectric conversion device taken along a line V-V of FIG. 4. Referring to FIG. 5, the first electrodes 113 are disposed on the first transparent conductive layer 111 and are spaced part from each other bay a predetermined electrode pitch. The first protective layer 115 is formed on the first electrodes 113. More specifically, the first protective layer 115 is formed across the first electrodes 113, and covers portions of the first transparent conductive layer 111 between the first electrodes 113 as depicted in FIG. 4.

As depicted in FIG. 5, an extension length 'l' of the current collecting electrode 116 is greater than a length of the outer sealing region S2. In some embodiments, the extension length 'l' of the current collecting electrode 116 is equal to or less than the sum of a length of the peripheral region NP, a length of the outer sealing region S2, the predetermined interval S3 between the outer sealing portion 140 and the inner sealing portion 130, and a length of the inner sealing region S1. That is, a first surface 116s corresponding to a starting point of the current collecting electrode 116 is disposed between an internal surface 140i of the outer sealing portion 140 and an internal surface 130i of the inner sealing portion 130. If the first surface 116s of the current collecting electrode 116 is disposed closer to the center of a photoelectric conversion region than the internal surface 130i of the inner sealing portion 130, an aperture ratio may be reduced by the current collecting electrode 116. Thus, the first surface 116s of the current collecting electrode 116 does not extend beyond the internal surface 130i of the inner sealing portion 130 and is not disposed within the photoelectric conversion region P.

The current collecting electrode 116 extends across the outer sealing portion 140 and the inner sealing portion 130, thereby increasing a total area of the current collecting electrode 116. If the size of the photoelectric conversion device is increased, a path for moving electrons from the first electrode 113 to the current collecting electrode 116 is increased and overall efficiency of the photoelectric conversion device is reduced. In the photoelectric conversion device depicted in FIG. 5, the area of the current collecting electrode 116 may be increased without reducing an aperture ratio, and thus the efficiency of the photoelectric conversion device is not dramatically reduced when the size of the photoelectric conversion device is increased.

A second surface 116f of the current collecting electrode 116 corresponds to an ending point of the current collecting electrode 116, which extends into the peripheral region NP, which is past an external surface 140o of the outer sealing portion 140.

As described above, according to the one or more of the above embodiments of the present invention, an electrolyte leakage of a photoelectric conversion device may be prevented due to a double sealing structure, and an area of a current collecting electrode may be increased to smoothly move electrons. These structures may serve to increase the overall efficiency of the photoelectric conversion device during operation.

While the present invention has been described in connection with certain exemplary embodiments, it will be appreciated by those skilled in the art that various modifications and changes may be made without departing from the scope of the present disclosure. It will also be appreciated by those of skill in the art that parts included in one embodiment are interchangeable with other embodiments; one or more parts from a depicted embodiment may be included with other depicted embodiments in any combination. For example, any of the various components described herein and/or depicted in the Figures may be combined, interchanged or excluded from other embodiments. With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity. Thus, while this invention has been described in connection with what is presently considered to be some exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A photoelectric conversion device, comprising:
    a first substrate and a second substrate spaced apart from each other;
    an inner sealing portion formed between the first substrate and the second substrate, wherein the inner sealing portion is positioned to define a photoelectric conversion region;
    an outer sealing portion formed between the first substrate and the second substrate and spaced apart from the inner sealing portion towards an outer side of the inner sealing portion;
    a plurality of first electrodes formed on a surface of the first substrate that faces the second substrate;
    a current collecting electrode electrically connecting the first electrodes to each other, wherein the current collecting electrode is formed on the first substrate to extend from an inner sealing region of the inner sealing portion, wherein the current collecting electrode extends past an outer sealing region of the outer sealing portion;
    a first protective layer disposed on the first electrodes; and
    a semiconductor layer formed to cover the first protective layer in the photoelectric conversion region, wherein the semiconductor layer comprises a photosensitive dye.

2. The photoelectric conversion device of claim 1, wherein the current collecting electrode extends past the outer sealing portion into a peripheral region.

3. The photoelectric conversion device of claim 2, wherein an extension length of the current collecting electrode is greater than a length of the outer sealing region.

4. The photoelectric conversion device of claim 3, wherein the extension length of the current collecting electrode is equal to or less than a sum of a length of the non-peripheral region, a length of the outer sealing region, an interval between the outer sealing portion and the inner sealing portion, and a length of the inner sealing region.

5. The photoelectric conversion device of claim 1, wherein the first protective layer overlaps at least a portion of the current collecting electrode.

6. The photoelectric conversion device of claim 5 further comprising:
- a plurality of second electrodes formed on a surface of the second substrate that faces the first substrate, wherein the plurality of second electrodes are spaced apart from each other; and
- a second protective layer disposed on the plurality of second electrodes.

7. The photoelectric conversion device of claim 1 further comprising a first transparent conductive layer formed on the first substrate, wherein the first electrodes are formed on the first transparent conductive layer.

8. The photoelectric conversion device of claim 7 further comprising:
- a second transparent conductive layer formed on the second substrate; and
- a catalyst layer formed on the second transparent conductive layer.

9. A photoelectric conversion device, comprising:
- a first substrate and a second substrate spaced apart from each other;
- an inner sealing portion formed between the first substrate and the second substrate, wherein the inner sealing portion is positioned to define a photoelectric conversion region;
- an outer sealing portion formed between the first substrate and the second substrate and spaced apart from an outer edge of the inner sealing portion;
- a plurality of first electrodes formed on a surface of the first substrate that faces the second substrate;
- a current collecting electrode electrically connecting the first electrodes to each other, wherein the current collecting electrode is formed on the first substrate to extend from an inner sealing region of the inner sealing portion, wherein the current collecting electrode extends past the outer sealing portion into a peripheral region:
- a first protective layer disposed on the first electrodes;
- a plurality of second electrodes formed on a surface of the second substrate that faces the first substrate, wherein the plurality of second electrodes are spaced apart from each other;
- a second protective layer disposed on the plurality of second electrodes; and
- a semiconductor layer formed to cover the first protective layer in the photoelectric conversion region, wherein the semiconductor layer comprises a photosensitive dye.

* * * * *